United States Patent [19]
Park

[11] Patent Number: 5,902,127
[45] Date of Patent: May 11, 1999

[54] METHODS FOR FORMING ISOLATION TRENCHES INCLUDING DOPED SILICON OXIDE

[75] Inventor: Tai-su Park, Kyungki-do, Rep. of Korea

[73] Assignee: Samsung Electronics Co., Ltd., Suwon, Rep. of Korea

[21] Appl. No.: 08/742,950

[22] Filed: Oct. 31, 1996

[30] Foreign Application Priority Data

Jun. 17, 1996 [KR] Rep. of Korea ................ 96-21853

[51] Int. Cl.⁶ ................................... H01L 21/76
[52] U.S. Cl. ................ 438/435; 438/424; 438/428; 438/433; 438/436; 438/438; 148/DIG. 50
[58] Field of Search ................. 437/67, 24, 25, 437/240; 148/DIG. 50; 438/424, 428, 433, 435, 434, 436, 438

[56] References Cited

U.S. PATENT DOCUMENTS

| | | | |
|---|---|---|---|
| 4,571,819 | 2/1986 | Rogers et al. | 29/576 W |
| 5,316,965 | 5/1994 | Philipossian et al. | 437/67 |
| 5,616,513 | 4/1997 | Shepard | 437/67 |

FOREIGN PATENT DOCUMENTS

| | | |
|---|---|---|
| 0111437 | 6/1985 | Japan . |
| 0049644 | 3/1987 | Japan . |
| 0143231 | 6/1989 | Japan . |
| 0226479 | 9/1993 | Japan . |

*Primary Examiner*—Trung Dang
*Attorney, Agent, or Firm*—Myers, Bigel, Sibley & Sajovec

[57] ABSTRACT

A method for forming a microelectronic structure includes the steps of forming a trench in a substrate and forming an insulating layer which fills the trench and covers the substrate. Ions can be implanted into the insulating layer which decrease an etch rate of the insulating layer, and portions of the insulating layer on the substrate can be removed while maintaining the insulating layer in the trench. In addition, the step of forming the insulating layer can include forming an undoped oxide layer on the substrate and forming a doped oxide layer on the undoped oxide layer wherein a void is formed in the doped oxide layer. The void can thus be reduced by reflowing the doped oxide layer.

22 Claims, 5 Drawing Sheets

METHODS FOR FORMING ISOLATION TRENCHES INCLUDING DOPED SILICON OXIDE

FIELD OF THE INVENTION

The present invention relates to the field of microelectronics and more particularly to isolation methods for microelectronic devices.

BACKGROUND OF THE INVENTION

The formation of an isolation trench can be an initial step in the fabrication of a microelectronic device. As such, the formation of the isolation trench influences the size of the active areas and processing margins for the following steps in the fabrication process. In the past, the local oxidation (LOCOS) method has been widely used to form isolation layers. As microelectronic structures have become more highly integrated and the width of the isolation layers has decreased, the bird's beak phenomenon has adversely affected the performance characteristics of the resulting devices. In addition, the thermal processing of the LOCOS method may cause defects in the crystal structure of the substrate, as well as distribution of dopants implanted therein. These effects may further degrade the operational characteristics of the microelectronic devices formed by the LOCOS method.

The trench isolation method has been developed to provide relatively small isolation areas on a microelectronic substrate. According to this method, a trench is formed in the substrate, and this trench is filled with an insulating material. The thickness of the isolation layer can thus be increased. Furthermore, the isolation can be formed by methods other than thermal oxidation so that defects caused by the thermal oxidation step of the LOCOS method can be reduced.

When forming a microelectronic device using the trench isolation method, however, it may be difficult to completely fill the trench with the insulating material without forming a void in the insulating material. In particular, when filling a trench with an insulating oxide layer using chemical vapor deposition (CVD) techniques, a void may be formed in the trench if the oxide does not have complete conformity. This void may later be exposed during a subsequent etch step, and a portion of the material used to form a gate electrode may remain in this void after patterning the gate electrode. This material may cause a short circuit between conductive layers thus reducing the yield and reliability of microelectronic devices formed thereby.

A conventional method for reducing the void when filling the trench will now be described with reference to FIGS. 1A–1D. As shown in FIG. 1A, a trench can be formed by etching an isolation region of the substrate 2 to a predetermined depth. An oxide layer 4 can be formed on the surface of the etched substrate to reduce stress between the substrate and the trench filling material which can be a polysilicon layer 6. The polysilicon layer 6 can be used as a mask to protect the substrate during a subsequent etch step which planarizes the surface of the material used to fill the trench. A nitride layer 8 can serve as a barrier layer to prevent doping of the substrate.

A doped oxide layer 10 having a thickness of 2.5 $\mu$m can be deposited on the nitride layer 8 as shown in FIG. 1B. In particular, the doped oxide layer 10 can be formed by chemical vapor deposition (CVD). Because the deposition rate of the CVD doped oxide layer 10 is faster at the upper corners of the trench than at the bottom or sidewalls of the trench, the void 12 may form in the trench. By heating the doped oxide layer 10 to a temperature in the range of 950° C. to 1,150° C. for about 30 minutes, the doped oxide layer 10 may reflow as shown in FIG. 1C. The void 12 is thus filled, the thickness of the oxide layer 10 is lowered, and the surface of the oxide layer is planarized.

As shown in FIG. 1D, the doped oxide layer 10, the nitride layer 8, and the polysilicon layer 6 can be etched back until the surface of the oxide layer 4 is exposed. The oxide layer 4 can then be selectively removed to expose active regions of the substrate 2. As shown, the trenches are filled with the remaining portions of the doped oxide layer 10, the nitride layer 8, the polysilicon layer 6, and the nitride layer 4. According to this method, the doped oxide layer can be provided by a boro-silicate glass (BSG), a phospho-silicate glass (PSG), or a borophosphorous-silicate glass (BPSG), and each of these materials can be deposited by chemical vapor deposition. Furthermore, these doped oxides can be reflowed at high temperatures to fill the void.

The doped oxide, however, may have a faster etching rate than a thermal oxide as shown in the graph of FIG. 2. In particular, FIG. 2 shows the etch rate of a borophosphorous-silicate glass in circles, and the etching rate of the thermal oxide is shown with rectangles. The relative etching rates of various oxides is discussed, for example, at page 217 of "Silicon Processing For The VLSI Era" by S. Wolf. Accordingly, a doped oxide layer filling the trench may be excessively etched during subsequent processing steps such as removing a pad oxide layer, removing a sacrificial oxide layer, and removing an ion implant buffer layer. As a result, the oxide layer remaining in the trench may not reach the surface of the substrate. Because portions of the trench sidewalls may be exposed, the gate of an adjacent transistor may cover the upper edge of the trench thereby causing a greater electric field at the edge of the trench than at the center of the channel. A hump phenomenon may thus occur causing a transistor to turn on twice as illustrated in FIG. 3. This hump phenomenon may reduce the performance characteristics of the transistor.

SUMMARY OF THE INVENTION

It is therefore an object of the present invention to provide improved methods for forming isolation trench structures.

It is another object of the present invention to provide methods for reducing voids in isolation trench structures.

It is still another object of the present invention to provide methods which increase an etch resistivity of an oxide layer for an isolation trench structure.

These and other objects are provided according to the present invention by methods including the steps of forming a trench in a substrate, forming an insulation layer which fills the trench, implanting ions into the insulating layer which decrease an etch rate of the layer, and removing portions of the insulating layer on the substrate while maintaining the insulating layer in the trench. By implanting ions which decrease the etch rate of the insulating layer, the isolation trench structure can be formed without significantly exposing the sidewalls of the trench. In particular, mask layers used to form the trench and left on the substrate when forming the insulating layer can be selectively removed without overetching the insulating layer in the trench or significantly exposing sidewalls on the trench.

In particular, the implanting step may include implanting nitrogen ($N^+$) ions at a dose on the order of $1\times10^{13}$ to $1\times10^{18}$ ions/cm$^2$. This dose of nitrogen is sufficient to increase the etch resistivity of the oxide layer to thus decrease the etching rate. The step of forming the insulating layer may include forming an undoped oxide layer on the substrate, and forming a doped oxide layer on the undoped oxide layer wherein a void is formed in the doped oxide layer in the trench. The doped oxide layer can then be reflowed to reduce the void. In particular, the reflowing step may include heating the insulating layer to a temperature of about 950° C. to 1,150° C. The undoped oxide layer can reduce a transfer of dopants from the doped oxide layer to the substrate. The doped oxide layer may include a material such as boro-silicate glass (BSG), phospho-silicate glass (PSG), or borophosphorous-silicate glass (BPSG). In addition, the step of forming the trench can be preceded by the step of forming a mask layer on the substrate wherein the mask layer exposes a portion of the substrate and wherein the trench is formed in the exposed portion of the substrate. The insulating layer thus covers the mask layer, and the removing step includes removing portions of the insulating layer on the mask layer and removing the mask layer.

According to an alternate aspect of the present invention, the method includes the steps of forming a trench in a substrate, forming an insulating layer which fills the trench and covers the substrate wherein a void is formed in the insulating layer in the trench, implanting ions into the insulating layer, and reflowing the implanted insulating layer to reduce the void. The implanted ions can allow the insulating layer to reflow when heated. In particular, by implanting only upper portions of the oxide layer, doping of the substrate can be reduced without requiring the deposition of a first undoped oxide layer and a second doped oxide layer.

In particular, the insulating layer can be implanted with ions such as boron ($B^+$) ions, phosphorous ($P^+$) ions, or difluoroborate ($BF_2^+$) ions. Furthermore, these ions can be implanted at a dose on the order of $1 \times 10^{15}$ to $1 \times 10^{17}$ ions/cm$^2$. The reflowing step can include heating the insulating layer to a temperature on the order of 950° C. to 1,150° C. and the insulating layer can be an oxide layer. In addition, nitrogen ($N^+$) ions can be implanted into the insulating layer and the nitrogen can increase an etch rate thereof. These nitrogen ions can be implanted at a dose on the order of $1 \times 10^{13}$ to $1 \times 10^{18}$ ions/cm$^2$.

By implanting the oxide layer filling the trench with nitrogen, the etch rate thereof can be reduced thus allowing the selective removal of the oxide layer over the substrate and any remaining mask layers without overetching the oxide in the trench or exposing significant portions of the trench sidewalls. By depositing a first undoped oxide layer in the trench and a second doped layer on the undoped layer, the doped layer can be reflowed to fill a void therein without significantly doping the substrate. In addition, by forming an undoped oxide layer which fills the trench and implanting portions of this oxide layer, the implanted portions of the oxide layer can be reflowed to fill voids without significantly doping the substrate. Accordingly, the undoped oxide can be deposited in one step without requiring a first undoped oxide deposition followed by a second doped oxide deposition.

DETAILED DESCRIPTION

Figure 1A:
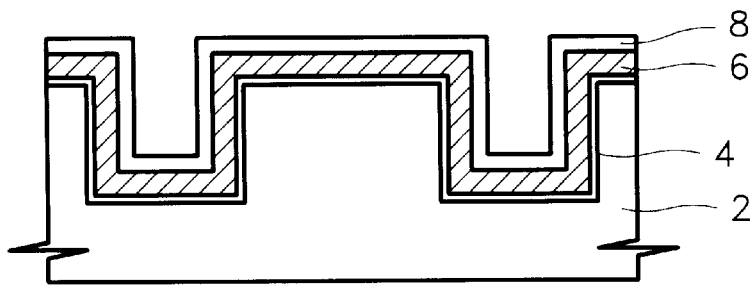
FIGS. 1A–1D are cross-sectional views illustrating steps of a method for forming isolation trenches according to the prior art.
Figure 1B:
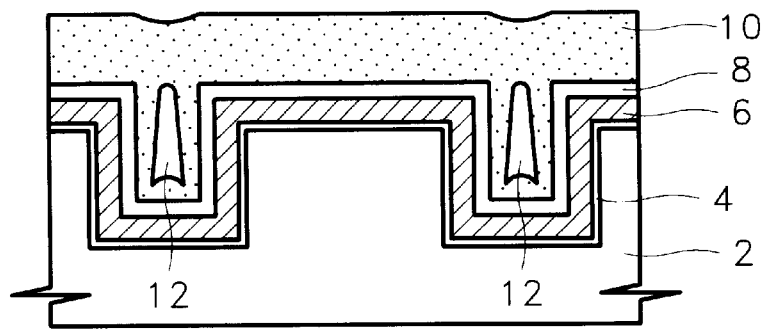
Figure 1C:
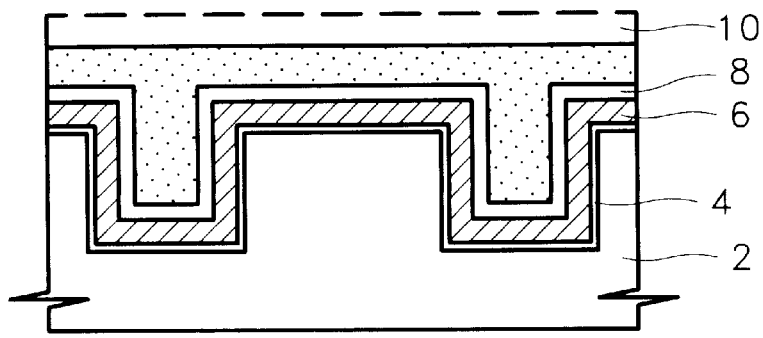
Figure 1D:
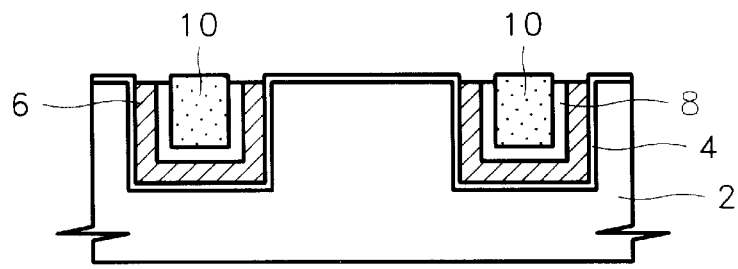
Figure 2:
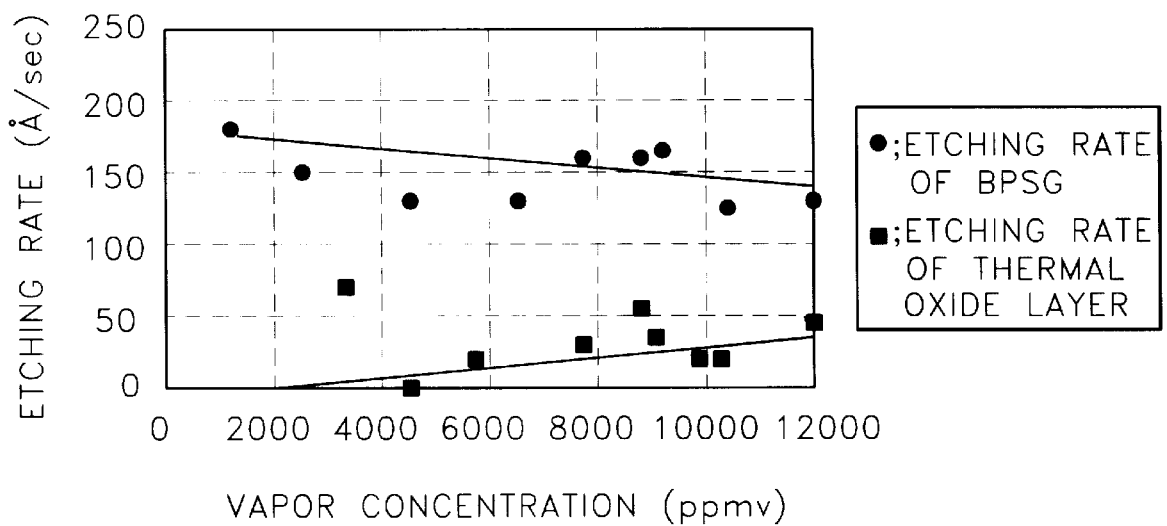
FIG. 2 is a graph illustrating the etch rates of a borophosphorous-silicate glass (BPSG) and a thermal oxide layer for a wet etch with various vapor concentrations according to the prior art.
Figure 3:
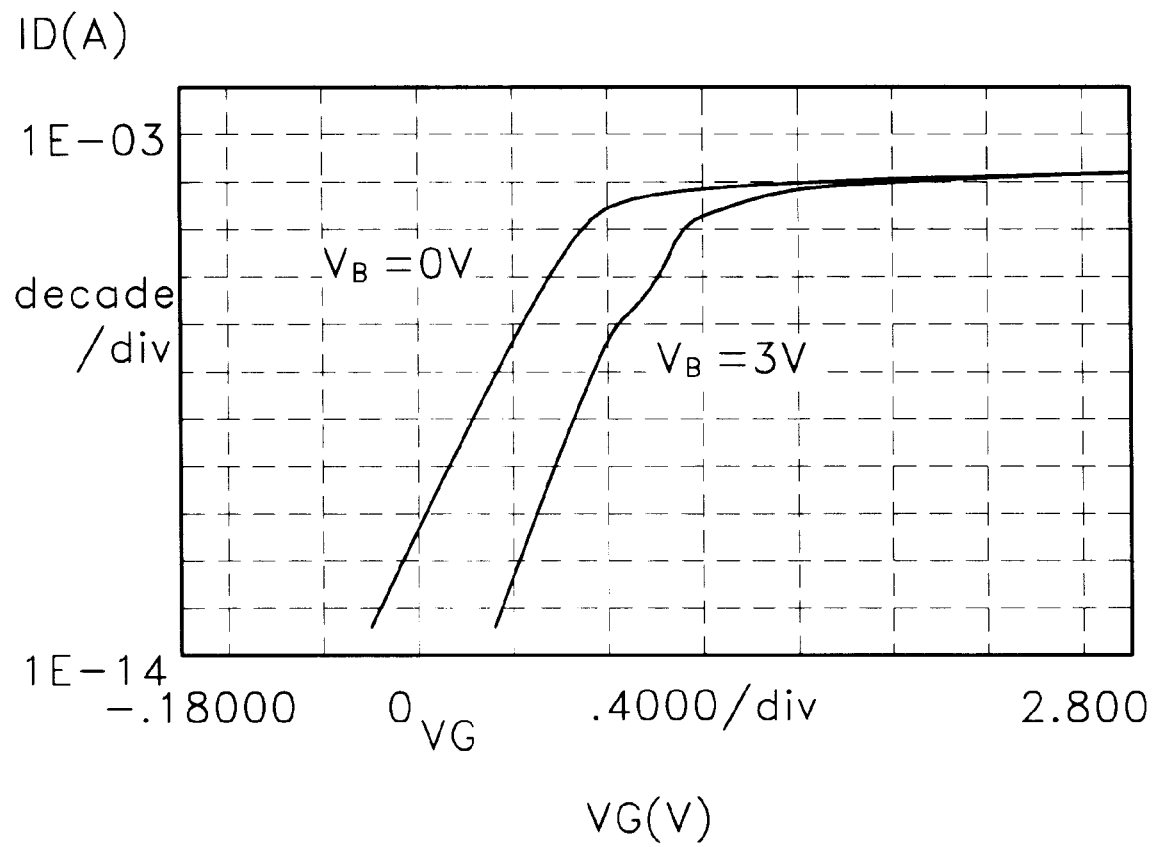
FIG. 3 is a graph illustrating a hump phenomenon for a transistor formed according to a trench isolation method of the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 4A:
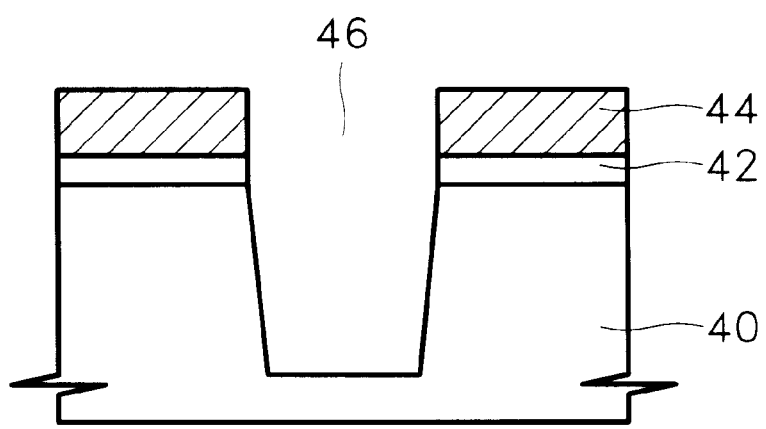
FIGS. 4A–4E are cross-sectional views illustrating a method for forming an isolation trench according to the present invention.

A method for forming isolation trenches according to the present invention will now be described with reference to FIGS. 4A to 4E. The formation of a trench 46 in a semiconductor substrate 40 is illustrated in FIG. 4A. After forming a pad oxide layer 42 and a nitride layer 44 on the substrate 40, a photoresist mask is used to define the active and isolation regions of the substrate. The nitride layer 44 and the pad oxide layer 42 over the isolation regions can then be patterned by anisotropic etching. The exposed portion of the substrate is then anisotropically etched to a predetermined depth using the patterned nitride layer 44 and the patterned oxide layer 42 as a mask thereby forming the trench 46.

Figure 4B:
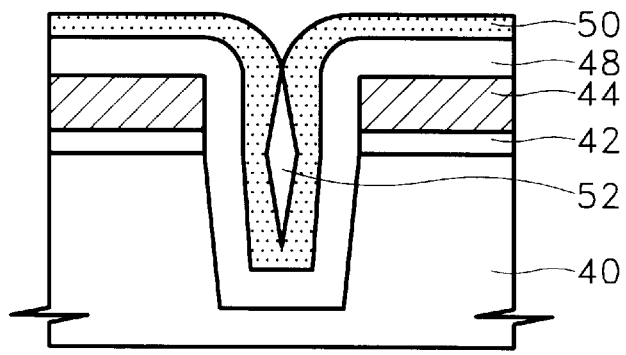
Figure 4C:
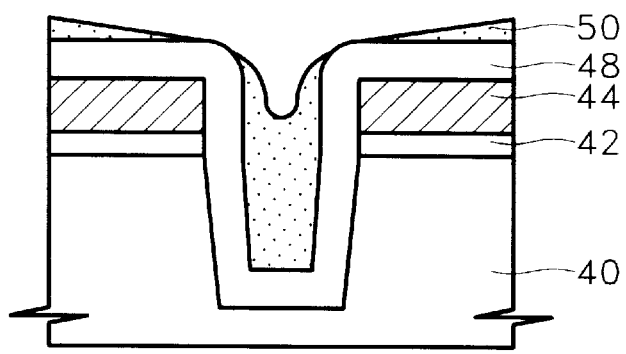

The depositions of the undoped oxide layer 48 and the doped oxide layer 50 are illustrated in FIG. 4B. As shown, a first undoped oxide layer 48 such as undoped silicate glass (USG) can be deposited on the substrate using a chemical vapor deposition (CVD) technique. A doped oxide layer such as boro-silicate glass (BSG), phospho-silicate glass (PSG), or borophosphorous-silicate glass (BPSG) can then be deposited on the first oxide layer 48 to fill the trench. In particular, a void 52 may be formed by the doped oxide layer 50 in the trench. As shown in FIG. 4C, the oxide layer 50 can be reflowed to fill the void 52. In particular, a thermal process wherein the doped oxide layer 50 is heated to a temperature in the range of 950° C. to 1,150° C. can be used to reflow the oxide layer 50 thus filling the void 52.

Figure 4D:
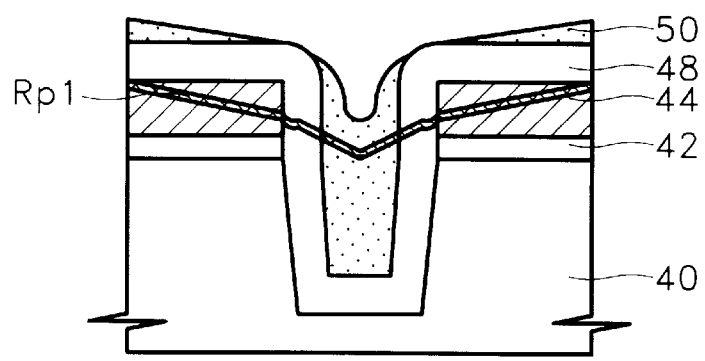

An ion implantation can then be used to increase the etch resistivity of the doped oxide layer 50 and the undoped oxide layer 48. In particular, nitrogen ($N^+$) ions can be implanted into the oxide layers 50 and 48 at a dose in the range of $1 \times 10^{13}$ to $1 \times 10^{18}$ ions/cm$^2$ after reflowing the doped oxide layer to fill the void. The implanted nitrogen ions thus increase the etching resistivity of the oxide layers 48 and 50. The ion implantation energy is preferably controlled so that an average implant range Rp1 extends to a middle portion of the thickness of the nitride layer 44 over active regions of the substrate as shown in FIG. 4D. Because the average implant range Rp1 varies according to the impurity being implanted, the implant energy should be adapted to the particular impurity being implanted.

Figure 4E:
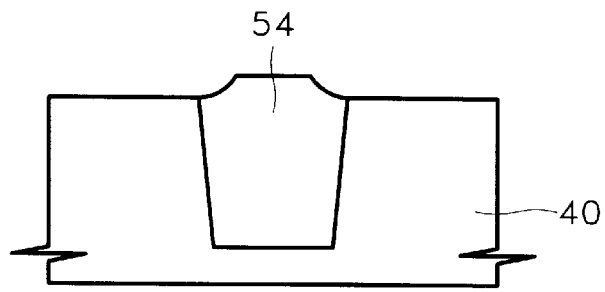

The completed isolation trench including the isolation layer 54 is illustrated in FIG. 4E. This structure can be completed by annealing the oxide layers 48 and 50 at a temperature sufficient to densify the portions of the oxide layers filling the trench. A surface planarization of the oxide layers 48 and 50 can be performed using a chemical mechanical polishing (CMP) technique or an etch-back technique. The nitride layer 44 and the pad oxide layer 42 can then be selectively removed using techniques known to those having skill in the art. The resulting structure including the isolation layer 54 in the trench is illustrated in FIG. 4E. Accordingly, the void formed in the trench can be collapsed and filled, and the etching resistivity of the oxide filling the trench can be increased.

Figure 5A:
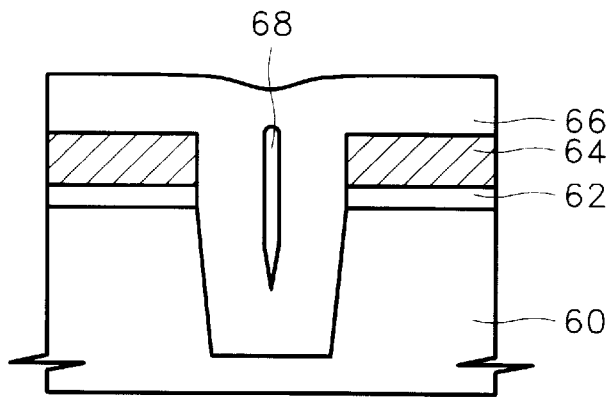
FIGS. 5A–5B are cross-sectional views illustrating a second method for forming an isolation trench according to the present invention.

A second method for forming isolation trenches according to the present invention will now be discussed with reference to FIGS. 5A and 5B. The pad oxide layer 62 and the nitride layer 64 can be patterned to form a mask exposing an isolation region of the substrate 60 as discussed above with regard to FIG. 4A. The trench can be formed by anisotropic etching and an undoped oxide layer 66 can be deposited thereon by chemical vapor deposition (CVD) techniques. As shown, this undoped oxide layer 66 can cover the surface of the substrate and fill the trench. A void 68, however, may be formed in the oxide in the trench. The thickness of this undoped oxide layer 66 should be sufficient to fill the trench when the oxide layer is reflowed.

Figure 5B:
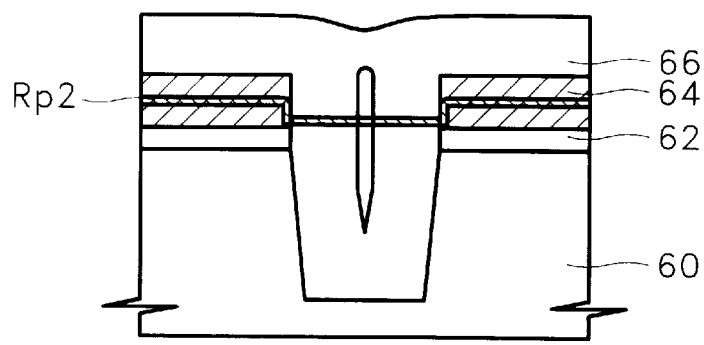

The undoped oxide layer 66 can be implanted with impurity ions as shown in FIG. 5B. In particular, the undoped oxide layer 66 can be implanted with impurity ions such as boron ($B^+$) ions, phosphorous ($P^+$) ions, or difluoroborate ($BF_2^+$) ions which can allow the oxide layer 66 to reflow when heated. The concentration of boron or phosphorous in a boro-silicate glass (BSG), a phospho-silicate glass (PSG), or a borophosphorous-silicate glass (BPSG) as discussed above with regard to FIG. 4B may be on the order of $1 \times 10^{20}$ ions/cm$^2$. Accordingly, to achieve a sufficient concentration of boron and/or phosphorous in the undoped oxide layer of FIG. 5A, the implant dose should be about $1 \times 10^{15}$ to $1 \times 10^{17}$ ions/cm$^2$. In addition, the implant energy should be controlled to provide an average implant range Rp2 for the implanted ions into the mask layer. As shown in FIG. 5B, the implant range is preferably sufficiently deep so that silicon will be able to reflow to fill the void 68, and the implant range may extend into the nitride layer 64 over the active regions of the substrate and into portions of the oxide adjacent the void. The implant energy, however, should not be made so high that the substrate is doped.

The isolation trench structure can be completed as discussed above with regard to FIGS. 4C–4E. That is, the implanted portion of the oxide layer 66 can be reflowed by a thermal process to fill the void 68. The reflowed oxide layer can then be implanted to increase an etch resistivity thereof. The oxide layer can then be planarized, and the nitride layer 64 and the oxide layer 62 can be selectively removed.

According to the trench isolation methods of the present invention, an oxide can be deposited in a trench and implanted to decrease an etch rate of the oxide layer. This decreased etch rate allows the selective removal of mask layers without removing excessive portions of the oxide filling the trench. In addition, an undoped oxide layer can be deposited and implanted to allow the oxide to reflow to fill a void formed therein. Accordingly, the step of forming a barrier layer to prevent the diffusion of impurity ions in the substrate can be omitted. In other words, by implanting only a surface portion of the oxide layer, a single oxide deposition can be used to form the isolation trench structure.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a microelectronic structure, said method comprising the steps of:
   forming a trench in a substrate;
   forming an insulating layer in said trench and covering said substrate;
   in implanting ions into said insulating layer which decrease an etch rate of said insulating layer; and
   removing portions of said insulating layer on said substrate while maintaining said insulating layer in said trench;
   wherein said step of forming said insulating layer comprises forming an undoped oxide layer on said substrate, and forming a doped oxide layer on said undoped oxide layer wherein a void is formed in said doped oxide layer in said trench.

2. A method according to claim 1 wherein said implanting step comprises implanting nitrogen ($N^+$) ions.

3. A method according to claim 2 wherein said nitrogen ions are implanted at a dose on the order of $1 \times 10^{13}$ to $1 \times 10^{18}$ ions/cm$^2$.

4. A method according to claim 1 wherein said step of forming said doped oxide layer is followed by reflowing said doped oxide layer wherein said reflowing step reduces said void.

5. A method according to claim 4 wherein said reflowing step comprises heating said insulating layer to a temperature of about 950° C. to 1,150° C.

6. A method according to claim 1 wherein said doped oxide layer comprises a material chosen from the group consisting of boro-silicate glass (BSG), phospho-silicate glass (PSG), and borophosphorous-silicate glass (BPSG).

7. A method according to claim 1 wherein said step of forming said trench is preceded by the step of forming a mask layer on said substrate wherein said mask layer exposes a portion of said substrate, wherein said trench is formed in said exposed portion of said substrate, wherein said insulating layer covers said mask layer, and wherein said removing step comprises removing portions of said insulating layer on said mask layer and removing said mask layer.

8. A method for forming a microelectronic structure, said method comprising the steps of:
   forming a trench in a substrate;
   forming an insulating layer which fills said trench and covers said substrate wherein a void is formed in said insulating layer in said trench;
   implanting ions into said insulating layer; and
   reflowing said implanted insulating layer wherein said reflowing step reduces said void.

9. A method according to claim 8 wherein said implanting step comprises implanting ions chosen from the group consisting of boron ($B^+$) ions, phosphorous ($P^+$) ions, and difluoroborate ($BF_2^+$) ions.

10. A method according to claim 9 wherein said implanted ions are implanted at a dose on the order of $1 \times 10^{15}$ to $1 \times 10^{17}$ ions/cm$^2$.

11. A method according to claim 8 wherein said reflowing step comprises heating said insulating layer to a temperature of about 950° C. to 1,500° C.

12. A method according to claim 8 wherein said insulating layer comprises an undoped oxide layer.

13. A method according to claim 8 further comprising the step of implanting nitrogen ($N^+$) ions into said insulating layer which decrease an etch rate of said insulating layer.

14. A method according to claim 13 wherein said nitrogen ions are implanted at a dose on the order of $1 \times 10^{13}$ to $1 \times 10^{18}$ ions/cm$^2$.

15. A method for forming a microelectronic structure, said method comprising the steps of:

forming a trench in a substrate;

forming an undoped insulating layer on said substrate;

forming a doped insulating layer on said undoped insulating layer opposite said substrate such that said undoped and doped insulating layers fill said trench and cover said substrate; and implanting ions into said doped and undoped insulating layers which decrease an etch rate of said doped and undoped insulating layers.

16. A method according to claim 15 wherein said implanting step comprises implanting nitrogen (N$^+$) ions.

17. A method according to claim 16 wherein said nitrogen ions are implanted at a dose on the order of $1 \times 10^{13}$ to $1 \times 10^{18}$ ions/cm$^2$.

18. A method according to claim 15 wherein said steps of forming said undoped and doped insulating layers comprise forming a layer of undoped oxide and implanting a surface portion of said undoped layer of oxide to form a doped oxide layer on an undoped oxide layer.

19. A method according to claim 15 wherein a void is formed in said doped insulating layer in said trench, and wherein said step of forming said doped insulating layer is followed by reflowing said doped insulating layer wherein said reflowing step reduces said void.

20. A method according to claim 19 wherein said reflowing step comprises heating said doped insulating layer to a temperature of about 950° C. to 1,150° C.

21. A method according to claim 15 wherein said doped insulating layer comprises a material chosen from the group consisting of boro-silicate glass (BSG), phospho-silicate glass (PSG), and borophosphorous-silicate glass (BPSG).

22. A method according to claim 15 wherein said step of forming said trench is preceded by the step of forming a mask layer on said substrate wherein said mask layer exposes a portion of said substrate, wherein said trench is formed in said exposed portion of said substrate, wherein said undoped and doped insulating layers cover said mask layer, and wherein said removing step comprises removing portions of said insulating layers on said mask layer and removing said mask layer.

* * * * *

UNITED STATES PATENT AND TRADEMARK OFFICE
CERTIFICATE OF CORRECTION

PATENT NO. : 5,902,127
DATED : May 11, 1999
INVENTOR(S) : Park

It is certified that error appears in the above-identified patent and that said Letters Patent is hereby corrected as shown below:

In the Claims:
Claim 1, line 6, delete the word "in" before "implanting".

Signed and Sealed this

Twenty-fifth Day of January, 2000

Attest:

Attesting Officer

*Acting Commissioner of Patents and Trademarks*